US008965007B2

(12) United States Patent
Zhang et al.

(10) Patent No.: US 8,965,007 B2
(45) Date of Patent: Feb. 24, 2015

(54) PERSONAL LISTENING DEVICE WITH SELF-ADJUSTING SOUND VOLUME

(75) Inventors: Jun-Wei Zhang, Guangdong (CN); Jun Zhang, Guangdong (CN); Tsung-Jen Chuang, New Taipei (TW); Shih-Fang Wong, New Taipei (TW)

(73) Assignees: Fu Tai Hua Industry (Shenzhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 496 days.

(21) Appl. No.: 13/241,278

(22) Filed: Sep. 23, 2011

(65) Prior Publication Data

US 2012/0250891 A1 Oct. 4, 2012

(30) Foreign Application Priority Data

Mar. 28, 2011 (CN) .......................... 2011 1 0074806

(51) Int. Cl.
*H03G 3/00* (2006.01)
*H04R 1/10* (2006.01)
*H04R 3/00* (2006.01)

(52) U.S. Cl.
CPC ................ *H04R 1/1091* (2013.01); *H04R 3/00* (2013.01)
USPC ................ 381/107; 381/55; 381/74; 381/332

(58) Field of Classification Search
CPC .......... H04R 3/007; H04R 3/002; H04R 3/00; H04R 29/001; H04R 29/003; H03F 1/52; H03F 2200/331; H03F 1/30; H03F 2200/03; H03G 11/00; H03G 11/008; H03G 11/02; H03G 11/04
USPC ............. 381/74, 164, 332, 87, 104, 107, 117, 381/55, 56, 58, 59, 94.9
See application file for complete search history.

(56) References Cited

U.S. PATENT DOCUMENTS

| | | | | |
|---|---|---|---|---|
| 2,237,448 | A * | 4/1941 | Reinhard | 381/55 |
| 4,084,474 | A * | 4/1978 | Leslie | 84/711 |
| 4,864,624 | A * | 9/1989 | Tichy | 381/55 |
| 5,532,437 | A | 7/1996 | Simplicean et al. | |
| 5,793,874 | A * | 8/1998 | Camire | 381/57 |
| 7,630,505 | B2 * | 12/2009 | Shimamura | 381/111 |
| 2003/0156728 | A1 * | 8/2003 | Chatani et al. | 381/345 |
| 2008/0025525 | A1 * | 1/2008 | Tsai | 381/74 |

FOREIGN PATENT DOCUMENTS

DE 2448506 A * 4/1976

* cited by examiner

*Primary Examiner* — Leshui Zhang
(74) *Attorney, Agent, or Firm* — Novak Druce Connolly Bove + Quigg LLP

(57) ABSTRACT

An exemplary personal listening device includes thermo-sensitive elements in its transducers. Each thermo-sensitive element senses temperature change of a corresponding transducer and changes a current flowing through the transducer according to temperature change of the transducer, to reflect the amount of time for which the personal listening device has been working.

2 Claims, 5 Drawing Sheets

PERSONAL LISTENING DEVICE WITH SELF-ADJUSTING SOUND VOLUME

BACKGROUND

1. Technical Field

The disclosure generally relates to a personal listening device having self-adjusting of the sound volume thereof.

2. Description of Related Art

Headphones and earphones are commonly used as personal listening devices. A typical headphone or earphone has a small-sized built-in speaker, and thus has a size and a shape suitable for attachment to a human ear. These personal listening devices directly output sound received from a sound playing device, such as an MP3 (Moving Picture Experts Group, audio layer 3) player. The personal listening device is worn close to the eardrum, and the sound vibration experienced by the eardrum may be great. Therefore, when a user wears the personal listening device for a long time or uses it at high volume, the eardrum may endure strong vibrations. The user may feel uncomfortable to the point of fatigue, and may even experience illness. Although users may adjust the sound volume by operating a volume control switch, many users still fail to regulate the volume when they are not paying full attention to the sound.

BRIEF DESCRIPTION OF THE DRAWINGS

The accompanying drawings are included to provide a further understanding of the disclosure. The drawings illustrate embodiments of the disclosure and, together with the description, serve to explain the principles of the disclosure.

DETAILED DESCRIPTION

Reference will be made to the drawings to describe certain exemplary embodiments of the present disclosure in detail.

In the present disclosure, the personal listening device can include a pair of earphones or only one earphone, or a pair of headphones or only one headphone, with or without wires. When the personal listening device is of a wireless type, only one earphone is generally required. In the following description, the personal listening device has a pair of earphones with a pair of earphone wires, as an example.

Figure 1:
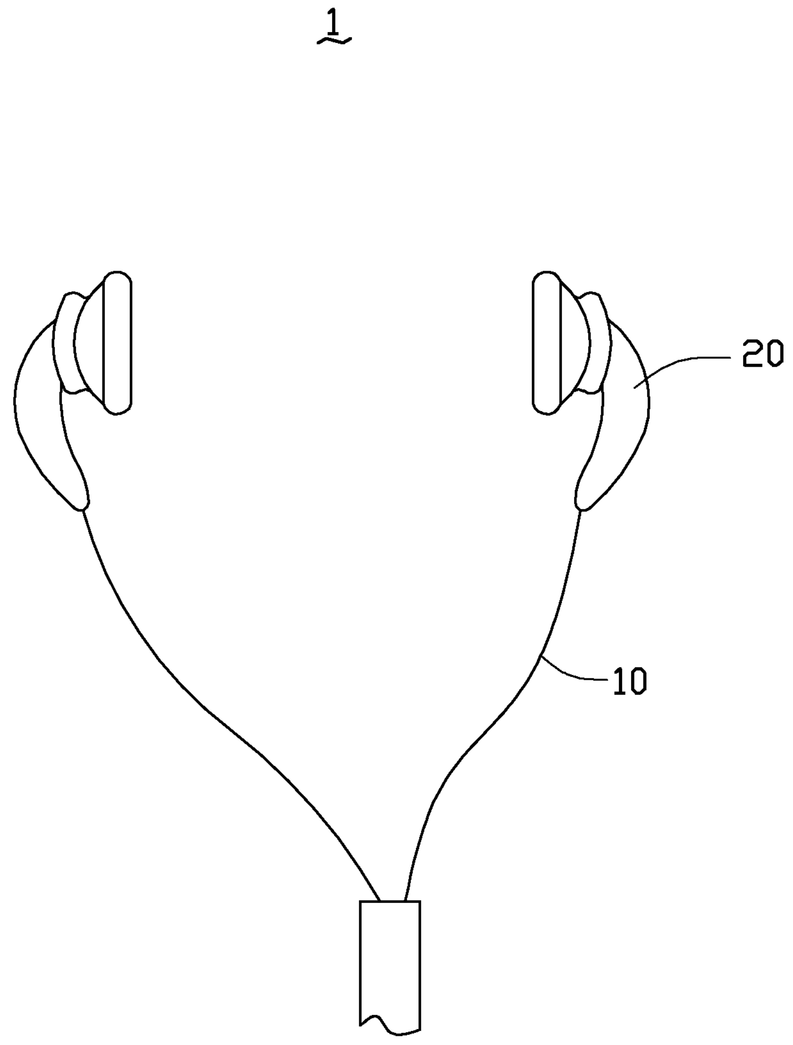
FIG. 1 is a plan view of a personal listening device according to an exemplary embodiment of the present disclosure, the personal listening device including a pair of earphone assemblies.

Referring to FIG. 1, a personal listening device according to an exemplary embodiment is shown. The personal listening device 1 includes a pair of earphone assemblies 20 and a pair of earphone lines 10. Each of the earphone lines 10 is connected between one earphone assembly 20 and a sound playing device (not shown). The earphone assemblies 20 are configured to convert received electric audio signals to sound.

Figure 2:
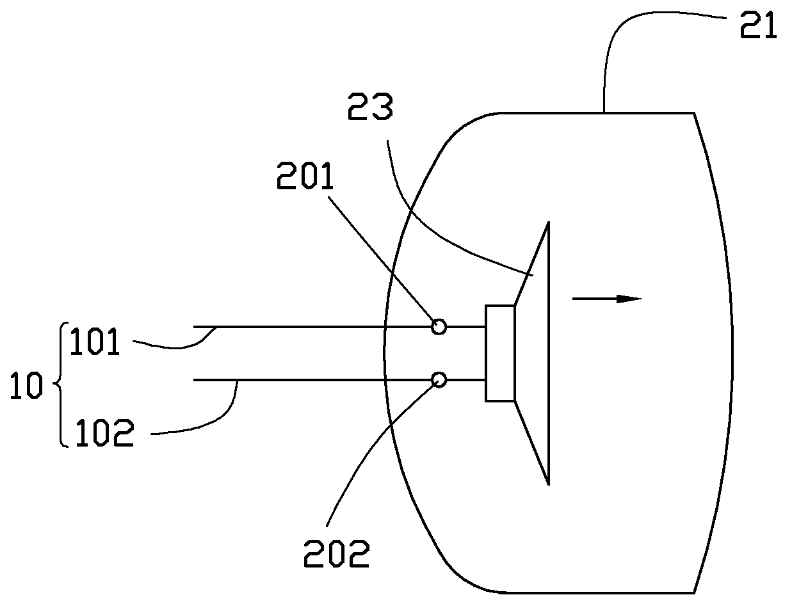
FIG. 2 is a schematic view of one earphone assembly and one earphone line of the personal listening device of FIG. 1, the earphone assembly including a transducer.
Figure 3:
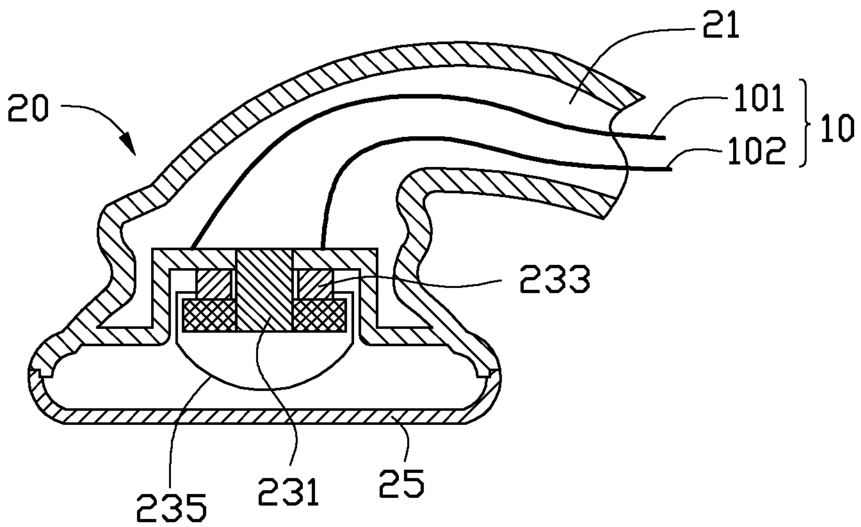
FIG. 3 is an enlarged, cross-sectional view of one earphone assembly of the personal listening device of FIG. 1.

Referring also to FIGS. 2 and 3, these show a schematic view and a cross-sectional view of one earphone assembly 20 and one earphone line 10. The earphone assembly 20 includes a housing 21 and a transducer 23. The housing 21 includes a cover 25 at an end thereof, with holes to allow the output of sound into the human ear. The housing 21 has a shape capable of being inserted into or attached over the ear. The transducer 23 is accommodated in an inner space of the housing 21, and is part of a system for converting audio signals to sound. In the exemplary embodiment, the housing 21 further includes a hole (not shown) at an end thereof opposite to the cover 25, so that the earphone line 10 is capable of passing through the hole to enter the housing 21. The transducer 23 includes two input terminals 201, 202. Each earphone line 10 includes two signal lines 101, 102 that are electrically coupled to the two input terminals 201, 202 of the transducer 23, for transmitting the audio signals to the transducer 23.

The transducer 23 includes a magnet 231, a vibration coil 233, and a vibration plate 235. The magnet 231 is a permanent magnet for generating a magnetic field. The vibration coil 233 is disposed within the magnetic field. Two ends of the vibration coil 233 serve as the input terminals 201, 202, and are electrically connected to the two signal lines 101, 102 to form a circuit branch. When the received audio signals flow through the circuit branch or the vibration coil 233, the received audio signals cause varying magnetic force, so as to generate vibrations. The vibration plate 235 is in contact with the vibration coil 233, and outputs vibrations according to the vibrations of the vibration coil 233, and thus audible sound is output to the ear. In the embodiment, the vibration coil 233 is a spiral winding surrounding the magnet 231. Preferably, the vibration coil 233 surrounds and is spaced from the magnet 231. A circular inner circumference of the vibration plate 235 are in contact with the vibration coil 233.

In the present disclosure, the transducer 23 has a thermo-sensitive element in the circuit branch defined between the two input terminals 201 and 202. The thermo-sensitive element is capable of changing the resistance value of the circuit branch according to any temperature change in the transducer 23. More particularly, when the temperature of the transducer 23 increases so as to reach a predetermined critical threshold value, the resistance value of the thermo-sensitive element increases sharply. Accordingly, the resistance value of the circuit branch is also increased, and the amount of current flowing through the vibration coil 233 is thereby reduced. In that case, the amplitude of the vibration coil 233 is decreased, and the volume of sound being output into the ear is correspondingly reduced. When the temperature of the transducer 23 is anywhere below the critical value, the thermo-sensitive element substantially maintains its original resistance value, and the resistance value of the circuit branch is substantially maintained. In such case, the vibration amplitude of the vibration coil 233 does not change or changes only slightly. That is, the personal listening device 1 keeps its original sound volume.

Figure 4:
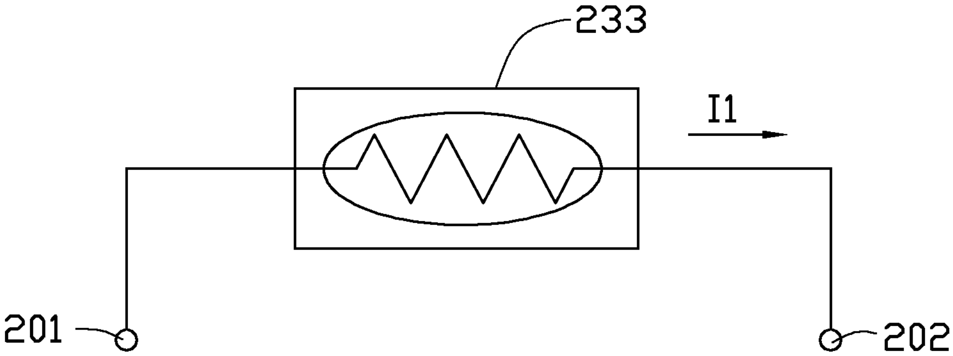
FIG. 4 is a circuit diagram illustrating an equivalent resistance in relation to the transducer of FIG. 2.

In the embodiment, the vibration coil 233 is made from a thermo-sensitive material so as to function as the thermo-sensitive element of the personal listening device 1. More particularly, the vibration coil 233 is made from a thermo-sensitive material having a positive temperature coefficient. The thermo-sensitive material can for example be $BaTiO_3$ ceramics. The equivalent resistor of the vibration coil 233 is similar to a thermistor, and the equivalent resistance value of the circuit branch between the two input terminals 201, 202 is substantially equal to the resistance value of the vibration coil 233, as shown in FIG. 4. A current I1 flowing through the vibration coil 233 defines a current flowing through the transducer 23. Therefore, the vibration coil 233 can directly serve as a thermo-sensitive element in the personal listening device 1.

Figure 5:
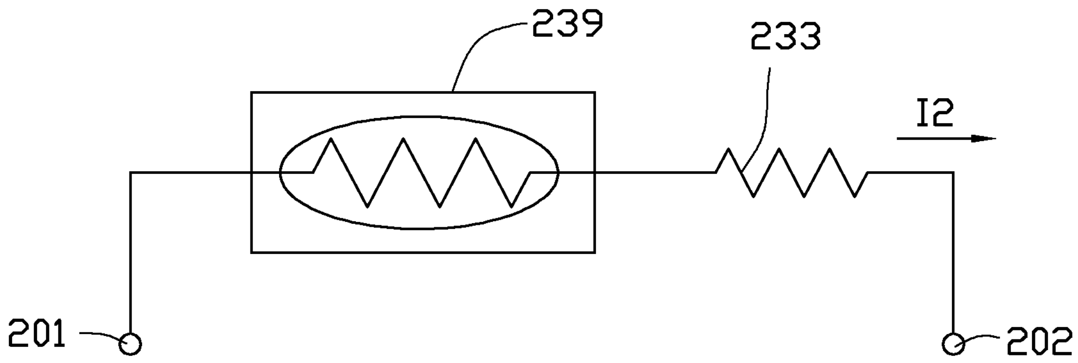
FIG. 5 is a circuit diagram illustrating an equivalent resistance in relation to a transducer of a personal listening device according to an alternative embodiment of the present disclosure.

Referring to FIG. 5, in an alternative embodiment, the thermo-sensitive element of the personal listening device 1 is a thermistor 239, which is connected in series to the vibration coil 233. The vibration coil 233 itself can be made from a conductive material which does not have a thermo-sensitive characteristic. The equivalent resistance value of the circuit branch between the two input terminals 201, 202 is substantially equal to the sum of a resistance value of the vibration coil 233 and a resistance value of the thermistor 239. A current I2 flowing through the series circuit formed by the vibration coil 233 and the thermistor 239 defines a current flowing through the transducer 23.

When the personal listening device 1 is working over a long period of time, the temperature of the transducer 23 gradually increases to become very hot. The thermo-sensitive element senses the temperature change, and increases the resistance value of the circuit branch sharply when the temperature reaches the critical value. At that point, the sound volume is automatically reduced to protect the user's ear, and this event reminds the user of the amount of time that the earphone assembly 20 has been working.

Although numerous characteristics and advantages of the present embodiments have been set out in the foregoing description, together with details of the structures and functions of the embodiments, the disclosure is illustrative only; and changes may be made in detail, especially in the matters of shape, size and arrangement of parts within the principles of the disclosure to the full extent indicated by the broad general meaning of the terms in which the appended claims are expressed.

What is claimed is:

1. A personal listening device, comprising:

two earphone assemblies wearing on the ears of a user, each earphone assembly of the two earphone assemblies comprising:

a housing;

two input terminals, coupled to the housing, for receiving electric audio signals generated from an external sound player; and a transducer, in the housing, connected between the two input terminals and configured for converting the electric audio signals to an audible sound, the transducer comprising:

a thermo-sensitive element, the thermo-sensitive element configured for sensing a temperature change of the transducer and for changing a current flowing through the transducer according to the temperature change of the transducer, and when the temperature sensed by the thermo-sensitive element increases to a critical value, the current flowing through the transducer sharply decreases so that a volume of the audible sound is automatically reduced to protect the user's ear, and the thermo-sensitive element functions as a vibration coil of the transducer for converting the electric audio signals to the audible sound.

2. The personal listening device of claim 1, wherein the thermo-sensitive element is a thermo-sensitive element having a positive temperature coefficient.

* * * * *